(12) United States Patent
Julien

(10) Patent No.: US 10,672,644 B2
(45) Date of Patent: Jun. 2, 2020

(54) PRODUCTION OF SEMICONDUCTOR REGIONS IN AN ELECTRONIC CHIP

(71) Applicant: STMicroelectronics (Rousset) SAS, Rousset (FR)

(72) Inventor: Franck Julien, La Penne sur Huveaune (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/992,481

(22) Filed: May 30, 2018

(65) Prior Publication Data

US 2019/0006229 A1 Jan. 3, 2019

(30) Foreign Application Priority Data

Jun. 30, 2017 (FR) ...................................... 17 56181

(51) Int. Cl.
*H01L 29/06* (2006.01)
*H01L 21/762* (2006.01)
(Continued)

(52) U.S. Cl.
CPC .... *H01L 21/76224* (2013.01); *H01L 21/0206* (2013.01); *H01L 21/0217* (2013.01); *H01L 21/02164* (2013.01); *H01L 21/28123* (2013.01); *H01L 21/31053* (2013.01); *H01L 21/31111* (2013.01); *H01L 21/76283* (2013.01); *H01L 21/823878* (2013.01); *H01L 21/84* (2013.01); *H01L 27/092* (2013.01); *H01L 27/1203* (2013.01); *H01L 29/0649* (2013.01); *H01L 29/66568* (2013.01); *H01L 21/82385* (2013.01)

(58) Field of Classification Search
CPC ..... H01L 21/76224–76237; H01L 21/823878; H01L 21/336; H01L 29/0649; H01L 29/0653; H01L 29/76; H01L 21/8238–823892
See application file for complete search history.

(56) References Cited

U.S. PATENT DOCUMENTS 7,282,402 B2 * 10/2007 Sadaka ................... H01L 21/84
257/E21.63
2002/0009851 A1 1/2002 Shukuri et al.
(Continued)

FOREIGN PATENT DOCUMENTS

EP 2037496 A1 3/2009

*Primary Examiner* — Eric A. Ward
*Assistant Examiner* — Eric K Ashbahian
(74) *Attorney, Agent, or Firm* — Slater Matsil, LLP

(57) ABSTRACT

A method can be used for fabricating first and second semiconductor regions separated by isolating trenches. A semiconductor substrate is covered with a first silicon nitride layer. The first region is covered with a protection layer that can be etched selectively with respect to the silicon nitride. The structure is covered with a second silicon nitride layer. The trenches are etched through the second and first silicon nitride layers and filled with a filling silicon oxide to a level situated above the protection layer. The second silicon nitride layer and the part of the first silicon nitride layer situated on the second region are selectively removed and the protection layer is removed. The filling oxide is selectively etched by wet etching, thus resulting in pits on the surface of the filling oxide around the second region.

22 Claims, 4 Drawing Sheets

(51) Int. Cl.
*H01L 21/02* (2006.01)
*H01L 21/311* (2006.01)
*H01L 21/84* (2006.01)
*H01L 21/8238* (2006.01)
*H01L 27/12* (2006.01)
*H01L 27/092* (2006.01)
*H01L 21/3105* (2006.01)
*H01L 21/28* (2006.01)
*H01L 29/66* (2006.01)

(56) References Cited

U.S. PATENT DOCUMENTS

| | | | |
|---|---|---|---|
| 2004/0065937 A1* | 4/2004 | Hsiao | H01L 27/115 257/510 |
| 2005/0269637 A1 | 12/2005 | Iwamatsu et al. | |
| 2006/0228851 A1* | 10/2006 | Sadaka | H01L 21/84 438/221 |
| 2011/0062527 A1* | 3/2011 | Shino | H01L 21/823814 257/369 |
| 2012/0256268 A1 | 10/2012 | Li et al. | |
| 2013/0178045 A1* | 7/2013 | Tan | H01L 21/28123 438/430 |
| 2014/0113419 A1* | 4/2014 | Scheiper | H01L 21/823807 438/218 |

* cited by examiner

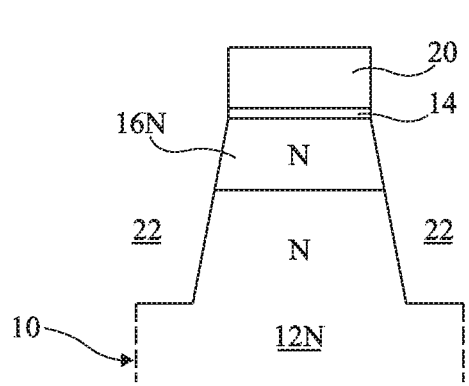
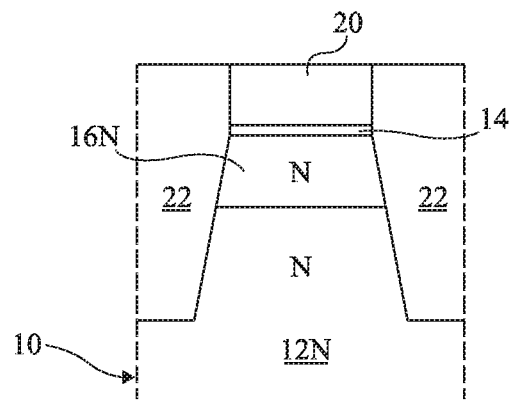
Fig 1A            Fig 1B
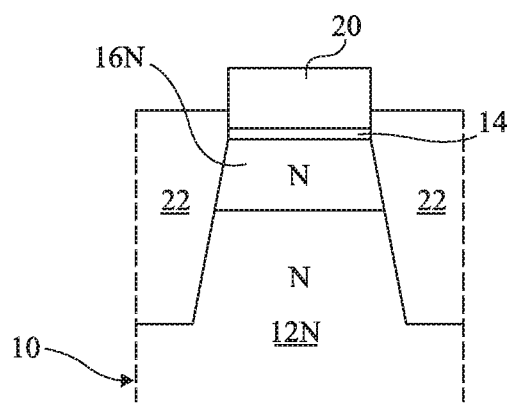
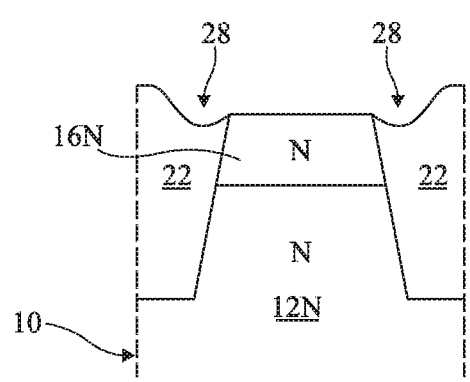
Fig 1C            Fig 1D
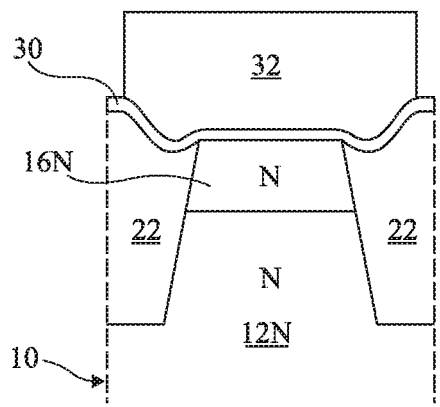
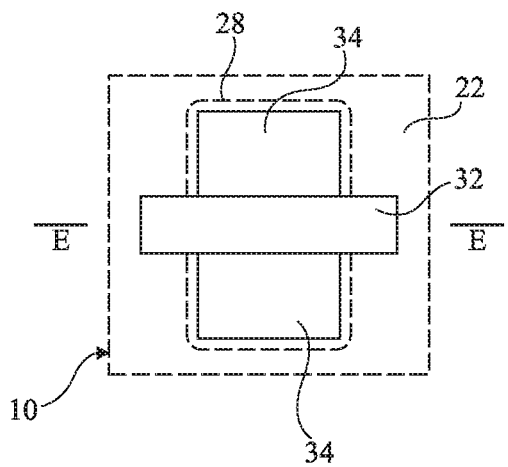
Fig 1E            Fig 1F

PRODUCTION OF SEMICONDUCTOR REGIONS IN AN ELECTRONIC CHIP

CROSS-REFERENCE TO RELATED APPLICATIONS

This application claims priority to French Patent Application No. 1756181, filed on Jun. 30, 2017, which application is hereby incorporated herein by reference.

This application is related to U.S. patent application Ser. No. 15/993,922, which claims priority to French Patent Application No. 1755226.

TECHNICAL FIELD

The present patent application relates to a method for producing semiconductor regions in an electronic chip.

BACKGROUND

Diverse problems can arise in an electronic chip comprising field-effect transistors.

In particular, one problem in such transistors is that, in general, the smaller the transistors, the higher, in relative value, the leakage current. This results in high energy consumption.

Another problem is that transistors designed to be identical in fact generally exhibit different electrical characteristics, in particular different threshold voltages. The differences between these electrical characteristics usually tend to get worse when the operating temperature decreases. This results in diverse difficulties in actually obtaining the envisaged electrical characteristics. These difficulties arise particularly in the case where the chip is provided for analogue operation, for example in a measurement device, and/or for cold operation, for example at negative ambient temperature. This usually leads to certain chips being rejected during post-fabrication checking.

Moreover, an electronic chip can comprise memory points of floating gate transistor type, surmounted by a control gate. In addition to the above-mentioned problems in respect of the transistors, such memory points exhibit problems of degradation of the transistor's gate insulator due to the fact that relatively high programming voltages are required to be applied.

The diverse known methods for solving the diverse problems mentioned hereinabove require numerous fabrication steps if it is desired to implement them simultaneously for different types, N-channel and P-channel, of transistors and/or of memory points.

SUMMARY

The present patent application relates to a method for producing semiconductor regions in an electronic chip. Particular embodiments relate to semiconductor regions intended for the formation of N-channel and P-channel transistors and/or memory points, and a device comprising such regions. Embodiments can mitigate all or some of the drawbacks described above.

Thus, one embodiment provides a method for fabricating first and second semiconductor regions separated by isolating trenches. A semiconductor substrate is covered with a first silicon nitride layer. The first region is covered with a protection layer that can be etched selectively with respect to the silicon nitride. The structure is covered with a second silicon nitride layer. The trenches are etched through the second and first silicon nitride layers and filled with a filling silicon oxide to a level situated above the protection layer. The second silicon nitride layer and the part of the first silicon nitride layer situated on the second region are selectively removed and the protection layer is removed. The filling oxide is selectively etched by wet etching, thus resulting in pits on the surface of the filling oxide around the second region. The part of the first silicon nitride layer situated on the first region is selectively removed.

According to one embodiment, the protection layer is a first silicon oxide layer and the protection layer is removed selectively by the said wet etching.

According to one embodiment, the method further comprises cleaning the structure.

According to one embodiment, the method further comprises the formation of a second silicon oxide layer on the substrate. The second silicon oxide layer can be removed when the structure is cleaned.

According to one embodiment, the trenches are filled with the filling oxide to a level situated above the second silicon nitride layer. The portions of the structure that are situated above the part of the second silicon nitride layer situated on the second region are removed by chemical-mechanical polishing. The oxide filling can be selectively etched.

According to one embodiment, the trenches are filled to a level between 2 and 15 nm above the protection layer.

According to one embodiment, after filling the trenches, the second silicon nitride layer has in the first region a thickness of between 30 and 100 nm.

According to one embodiment, the protection layer has a thickness of between 2 and 20 nm.

According to one embodiment, the method further comprises forming by thermal oxidation a third silicon oxide layer on the second region. The third silicon oxide layer can be removed when the protection layer is removed.

According to one embodiment, the substrate is the upper semiconductor layer of an SOI structure.

According to one embodiment, the substrate is a bulk substrate.

One embodiment provides the method hereinabove for the simultaneous fabrication of an N-channel transistor and of a P-channel transistor. The method includes P-type doping the first region and N-type doping the second region. After selectively removing the part of the first silicon nitride layer situated on the first region, the N-channel transistor is formed in and on the first region and the P-channel transistor is formed in and on the second region.

One embodiment provides a device comprising first and second semiconductor regions separated by trenches filled with an insulator. The surface of the insulator has, around the second region, a shape in the form of pits and, around the first region, a shape which is different from the shape around the second region.

One embodiment provides an electronic chip comprising the device hereinabove, an N-channel transistor situated in and on the first region, and a P-channel transistor situated in and on the second region.

BRIEF DESCRIPTION OF THE DRAWINGS

These features and advantages, along with others, will be presented in detail in the following description of particular embodiments, provided without limitation and in relation to the appended figures among which:

FIGS. 1A to 1E are partial and schematic sectional views illustrating steps of a method for fabricating a P-channel transistor;

FIG. 1F is a schematic view from above of the structure of FIG. 1E;

DETAILED DESCRIPTION OF ILLUSTRATIVE EMBODIMENTS

Figure 2A:
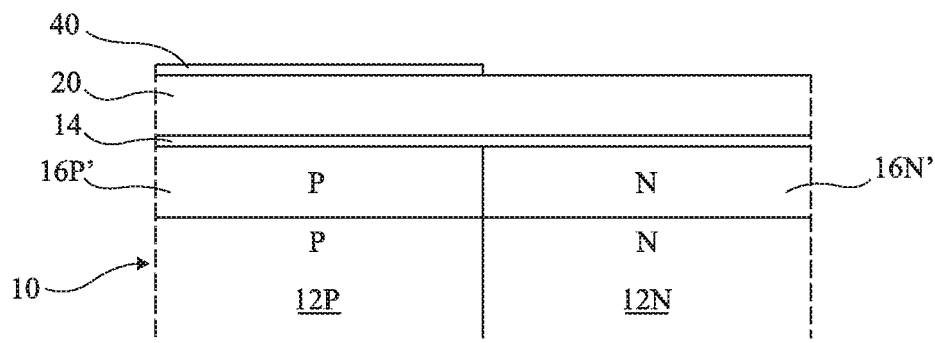
FIGS. 2A to 2H are partial and schematic sectional views illustrating steps of an embodiment of a method for fabricating an N-channel transistor and a P-channel transistor.

The various figures have not been drawn to scale and, in addition, in the various figures, elements that are the same have been referenced by the same references. For the sake of clarity, only those elements which are useful to the comprehension of the described embodiments have been shown and are described in detail. In particular, diverse elements of the transistors, such as spacers, are not represented.

In the description which follows, when making reference to position qualifiers such as the terms, "left", "right", "above", "upper", "lower", etc., or to orientation qualifiers such as the terms "horizontal" or "vertical", reference is made to the orientation of the element concerned in the figures considered, it being understood that, in practice, the devices described may be oriented differently.

FIGS. 1A to 1E are partial and schematic sectional views illustrating steps of a method for fabricating a P-channel transistor.

In the step of FIG. 1A, a semiconductor substrate 10 comprises by way of example an N-type doped well 12N. In the upper part of the well 12N, an N-type doped region 16N has been formed, and its doping level has been selected as a function of the desired electrical characteristics of the transistor. By way of variant, the well 12N and the region 16N will be doped in later steps of the method. The substrate is covered with a fine silicon oxide layer 14, of thickness typically between 2 and 20 nm. A silicon nitride layer 20 is thereafter deposited on the structure, and then trenches 22 passing through the silicon nitride are etched (only halves of the trenches are visible in the figures). The trenches penetrate into the substrate and delimit a portion of the region 16N.

In the step of FIG. 1B, the trenches are filled with an insulator, for example silicon oxide, and then a planarization is carried out as far as the upper level of the silicon nitride 20.

In the step of FIG. 1C, the insulator of the trenches 22 is selectively etched with respect to the silicon nitride 20, for example to a level situated above the region 16N.

In the step of FIG. 1D, the silicon nitride is removed by selective etching with respect to the insulator of the trenches 22. The structure is thereafter cleaned, so as to eliminate the oxide of the layer 14, still present on the region 16N. This cleaning is, for example, carried out in a solution based on hydrofluoric acid. This cleaning causes the formation of an annular pit 28 on the surface of the insulator of the trenches around the region 16N.

In the step of FIG. 1E, a P-channel MOS transistor is formed in and on the region 16N. In particular, a gate insulator layer 30 and a gate 32 are formed.

FIG. 1F is a view from above of the structure of FIG. 1E. The insulating layer 30 is not represented. Viewed from above, the gate 32 extends over the width of the region 16N. Drain and source regions 34 have been formed on each side of the gate.

The parameters of the method hereinabove, in particular the etching of the insulator of the trenches 22 in the step of FIG. 1C and the cleaning in the step of FIG. 1D, have been adjusted so as to optimize the electrical characteristics of the transistor, for example to minimize its leakage current. This adjustment is for example carried out by trials. Indeed, the electrical characteristics, such as the threshold voltage and the leakage current, are different at the edges and at the center of the transistor because of diverse edge effects. Adjusting the parameters of the method makes it possible to obtain a pit shape which reduces these edge effects.

A method making it possible to obtain a P-channel transistor of optimal electrical characteristics has been described hereinabove. However, this method is not suitable for obtaining an N-channel transistor of optimal electrical characteristics. Indeed, the edge effects are different in the N-channel transistor and in the P-channel transistor. In particular, when the N-type region 16N is replaced by a P-type region 16P, the dopant atoms tend to migrate in the insulator of the trenches in the course of diverse annealings provided for in the method, especially when dealing with boron atoms and trenches filled with silicon oxide. It follows from this that the doping level of the region 16P is lower at the edges of the transistor than at the center of the transistor. Thus, the pit shape obtained in the P-channel transistor is not the shape which makes it possible to minimize the edge effects of the N-channel transistor.

FIGS. 2A to 2H are partial and schematic sectional views illustrating steps of an embodiment of a method for fabricating an N-channel transistor on the left side of the figures and of a P-channel transistor on the right side. This method makes it possible to optimize the electrical characteristics of the P-channel transistors and of the N-channel transistors.

In the step of FIG. 2A, a substrate 10 has been provided. The substrate 10 is here by way of example a bulk semiconductor substrate, of silicon for example. The left part of the substrate portion represented is a P-type doped well 12P. The right part of the substrate portion represented is an N-type doped well 12N. By way of variant, the substrate may be a semiconductor layer covering an insulating layer on a support, that is to say the upper semiconductor layer of an SOI ("Silicon On Insulator") structure.

Preferably, on the left side, a P-type doped layer 16P', and, on the right side, an N-type doped layer 16N', are implanted in the substrate. The doping levels of the layer 16P' and of the layer 16N' are, for example, greater than $10^{17}$ atoms/cm$^3$. In the variant where the substrate is a thin layer of monocrystalline silicon covering the insulating layer of an SOI structure, the layers 16P' and 16N' can extend throughout the thickness of the thin monocrystalline silicon layer.

By way of variant, the well 12P, the well 12N, the layer 16P' and/or the layer 16N', instead of being doped starting from the step of FIG. 2A, may be doped in later steps of the method.

Preferably, the substrate is covered with a silicon oxide layer 14 of thickness for example of between 2 and 20 nm.

After this, a silicon nitride layer 20 covering the structure is formed. The thickness of the layer 20 is, for example, between 30 and 100 nm.

Thereafter, a layer 40 of a material that can be etched selectively with respect to the silicon nitride, for example silicon oxide, is formed only on the layer 16P'. The layer 40 preferably has a thickness of between 2 and 20 nm. The function of the layer 40 will subsequently be to protect the silicon nitride layer 20.

Figure 2B:
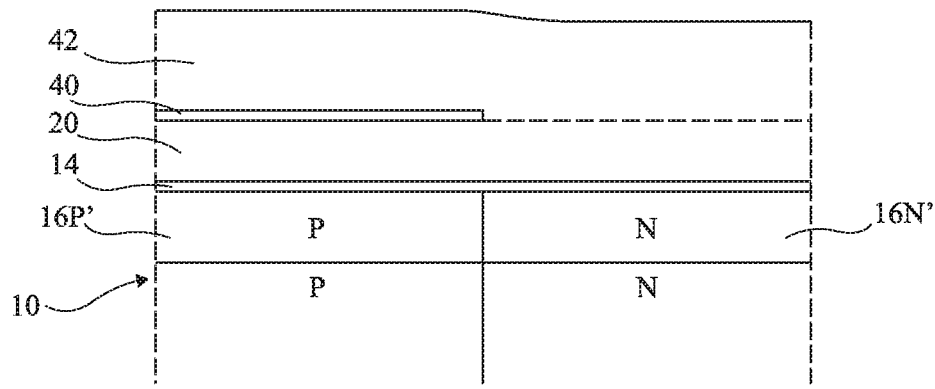

In the step of FIG. 2B, the structure is covered with a silicon nitride layer 42. The thickness of the layer 42 is for example between 30 and 100 nm. It follows from this that the silicon nitride layers 20 and 42 are directly on one another on the side of the region 16N', and are separated by the layer 40 on the side of the region 16P'.

Figure 2C:
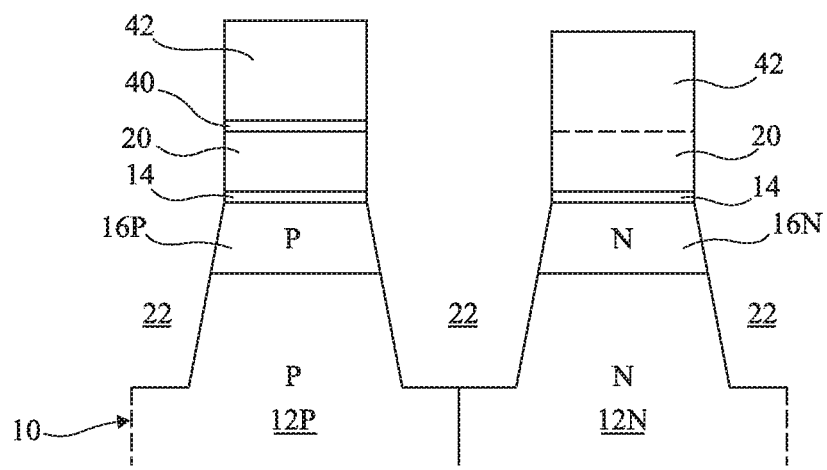

In the step of FIG. 2C, trenches 22 are etched, passing all the way through, on the left side, the two silicon nitride layers 20 and 42 and the region 16P', and, on the right side, the layers 20, 40 and 42 and the region 16N'. The trenches 22 delimit a semiconductor region 16P in the layer 16P' and a semiconductor region 16N in the layer 16N'. The trenches 22 surround the regions 16P and 16N.

Figure 2D:
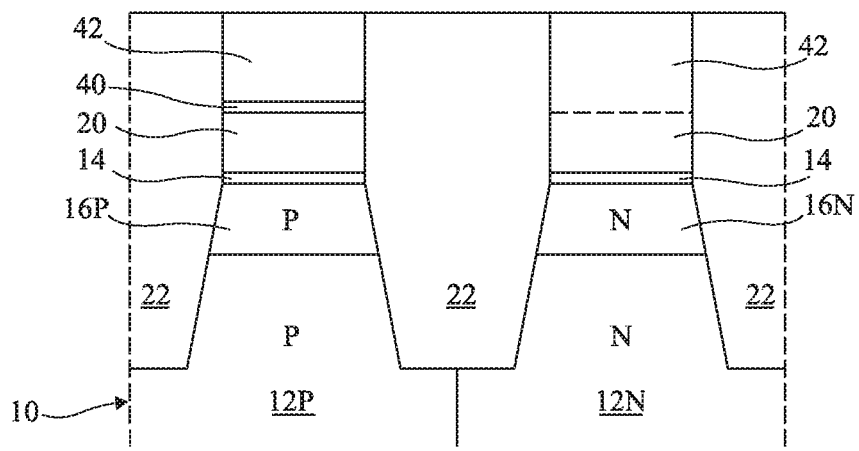

In the step of FIG. 2D, the trenches 22 are filled with an insulator, for example silicon oxide. By way of example, the whole of the structure is covered with this insulator to a level situated above that of the silicon nitride layer 42, and a chemical-mechanical polishing is undertaken thereafter. The polishing removes the parts of the structure which are situated above the upper level of the silicon nitride covering the region 16N, or above a level situated in the silicon nitride layer 42. After polishing, the silicon nitride of the layer 42 is flush with the surface of the insulator of the trenches, and the layer 42 has on the side of the region 16P a thickness of for example between 30 and 100 nm.

Figure 2E:
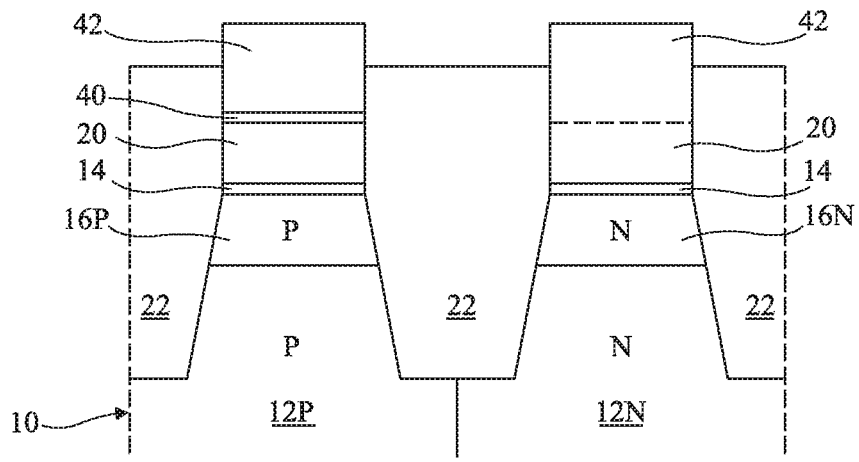

In the step of FIG. 2E, the insulator of the trenches 22 is etched selectively to a level situated above that of the protection layer 40, for example by a hydrofluoric acid solution or one based on hydrofluoric acid. By way of example, the surface of the insulator of the trenches after etching is situated between 2 and 15 nm above the upper surface of the protection layer 40.

Figure 2F:
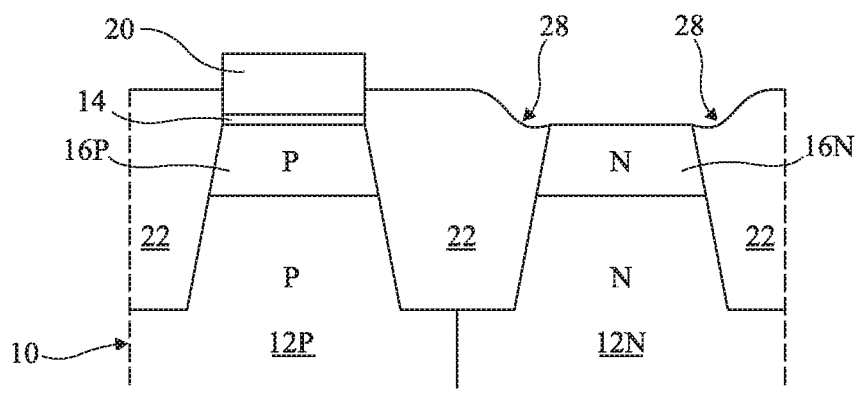

In the step of FIG. 2F, a selective etching of the silicon nitride is performed, for example by a phosphoric acid solution or one based on phosphoric acid. On the side of the region 16N, the silicon nitride of the two layers 20 and 42 is removed. On the side of the region 16P, the silicon nitride of the layer 42 is removed, but the silicon nitride of the layer 20 is not removed, since it is protected by the layer 40.

The insulator of the trenches is thereafter etched and the protection layer 40 is removed, for example, by a hydrofluoric acid solution or one based on hydrofluoric acid. The etching is continued until the level of the insulator of the trenches, dependent on the desired characteristics of the transistors, is for example between 20 nm below and 30 nm above the regions 16N and 16P. The possible layer 14 is removed in this step on the side of the region 16N. This etching forms an annular pit 28 on the surface of the insulator of the trenches around the region 16N. Due to the presence of the silicon nitride of the layer 20 above the region 16P, the etching is not accompanied by pit formation around the region 16P.

Figure 2G:
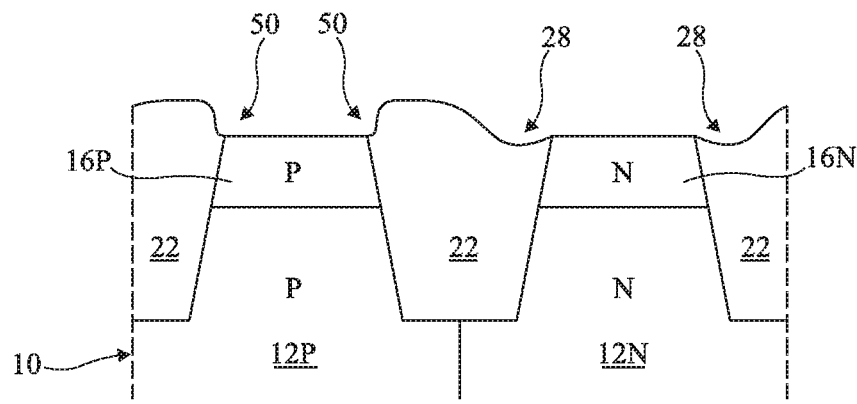

In the step of FIG. 2G, the silicon nitride of the layer 20 is selectively removed on the region 16P, for example by a solution based on phosphoric acid. A cleaning is undertaken thereafter, for example by a hydrofluoric acid solution or one based on hydrofluoric acid. The possible layer 14 is thus removed on the side of the region 16P. This step further hollows out the pits 28 around the regions 16N. Around the regions 16P, the surface of the insulator of the trenches 22 has a different shape from that of the pits 28. By way of example, starting from the edge of the region 16P, the surface meets up with the upper level of the insulator of the trenches via slopes 50.

Figure 2H:
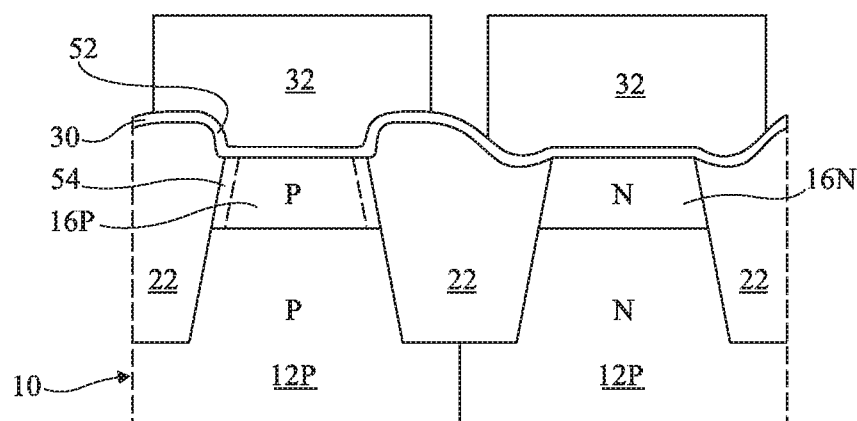

In the step of FIG. 2H, the N-channel and P-channel transistors in and on respectively the regions 16P and 16N are produced. In particular, a gate insulator layer 30 and the gates 32 are formed. By way of example, the gate insulator 30 is formed by thermal oxidation and/or by deposition. The gate insulator can comprise a material with high dielectric permittivity such as, for example, hafnium oxide. By way of example, the gate insulator is deposited in a compliant manner, and thus, on the side of the region 16P, in a part 52 situated on the slopes 50 (approximately plumb with the edges of the region 16P), the thickness, taken vertically, of the gate insulator is greater than that of the gate insulator in the horizontal parts (that is to say central parts situated above a central part of the region 16P).

Figure 2I:
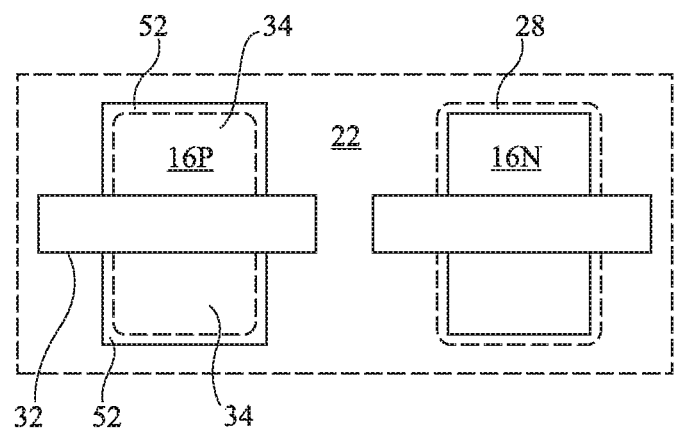
FIG. 2I is a schematic view from above of the structure of FIG. 2H.

FIG. 2I is a schematic view from above of the structure of FIG. 2H, in which the gate insulator is not represented. The gates 32 extend across the regions 16P and 16N between drain and source regions 34. In the case of transistors formed side by side, the gate may be common to two transistors. By way of example, a single transistor has been represented in and on each of the regions 16P and 16N, but it is possible to form several transistors on each of the regions 16P and 16N, for example by forming several parallel gates.

As indicated previously, when the channel region of the transistor is a P-type region 16P, the doping level of the peripheral parts of the region 16P in contact with the trenches 22 may be lower than at the centre of the region 16P, in particular when the dopant atoms are boron and when the insulator of the trenches is silicon oxide. These more lightly doped peripheral regions are indicated by the reference 54 in FIG. 2H. This results in a lower threshold voltage of the transistor in these peripheral regions than in the central regions with homogeneous doping. This is compensated in part or entirely by the fact that the gate insulator 30 is thicker in the regions 52 surmounting the regions 54 than in the central regions, since the threshold voltage increases when the thickness of the gate insulator increases. Moreover, the properties of the regions 54 are generally not identical in transistors designed to be identical, and this results in differences between the threshold voltages of the peripheral regions of the various transistors. The regions 52 make it possible to partly compensate these differences.

The parameters of the method, in particular the thicknesses of the layers 20, 40 and 42, and of the possible layer 14, and the steps of etching the insulator of the trenches of FIGS. 2E, 2F and of cleaning of FIG. 2G, can be tailored so as to obtain at one and the same time optimal electrical characteristics for the P-channel transistor and for the N-channel transistor, and/or to obtain particularly reduced differences between transistors designed to be identical. Optionally, in the step of FIG. 2F, after removal of the silicon nitride unprotected by the layer 40 and before etching of the layer 40 and of the insulator of the trenches, a thermal oxidation (not represented) can furthermore be undertaken, making it possible to obtain a layer 14 solely on the side of the region 16N, or to obtain a thicker layer 14 on the region 16N than on the region 16P. This thermal oxidation is then tailored together with the other parameters of the method so as to optimize the electrical characteristics of the transistors and/or reduce the differences between transistors designed to be identical.

According to one advantage, optimized N-channel and P-channel transistors are obtained simultaneously, in a simple manner and in a particularly reduced number of steps. Furthermore, in the case where regions 52 are provided, the advantage of reliability of the method of FIGS. 1A to 1F is preserved, related to the fact that the regions 52 are auto-aligned.

According to another advantage, an N-channel transistor and a P-channel transistor exhibiting particularly low leakage currents, even for small transistors, are obtained simultaneously. This results in particularly low energy consumption, in particular for a chip comprising such transistors.

According to another advantage, when using this method to produce, in addition to the P-channel transistor, several N-channel transistors designed to be identical, N-channel transistors whose electrical characteristics are quasi-identical, including under cold operation, are obtained. Therefore, this method exhibits particular interest in respect of the production of transistors intended to be used in a measurement device. Furthermore, this results in particularly high fabrication efficiency.

Particular embodiments have been described. Diverse variants and modifications will be apparent to those skilled in the art. In particular, the method may be adapted for the simultaneous production of transistors which differ for example by their gate insulator thickness and/or by their gate insulator materials. For this purpose the gate insulator layer 30 formed in the step of FIG. 2H may have thicknesses and/or be made of materials which differ at the locations of the various transistors. It is thus possible to obtain transistors which differ by their threshold voltages and/or their voltages of use. Moreover, the transistors can then be of the same channel type, although the production of P-channel and N-channel transistors has been described.

Furthermore, although the embodiments described hereinabove relate to the fabrication of transistors, the methods described can be adapted for the fabrication of other components, for example for the fabrication of memory points. Accordingly, in the step of FIG. 2H, the gates of the transistors are covered with an insulating layer, not represented, this insulating layer comprising for example a silicon nitride layer between two silicon oxide layers, and a gate (not represented) is formed on this insulating layer. This gate thus constitutes a control gate for the memory point, the gate 32 constituting a floating gate of the memory point. By way of variant, a transistor and another component, such as a memory point, can also be formed simultaneously. The two components may be of the same channel type or of different channel types.

What is claimed is:

1. A method for fabricating a semiconductor device, the method comprising:
   covering first and second regions of a semiconductor substrate with a first silicon nitride layer;
   covering the first region of the semiconductor substrate with a protection layer that can be etched selectively with respect to silicon nitride;
   forming a second silicon nitride layer over the protection layer;
   etching trenches through the second and first silicon nitride layers and into the semiconductor substrate;
   filling the trenches with a filling oxide to a level above an upper surface of the protection layer;
   selectively removing the second silicon nitride layer and first silicon nitride layer disposed over the second region;
   removing the protection layer;
   selectively etching the filling oxide by wet etching so that pits are formed on a surface of the filling oxide around the second region; and
   selectively removing the first silicon nitride layer disposed over the first region.

2. The method according to claim 1, wherein the protection layer comprises a first silicon oxide layer.

3. The method according to claim 2, wherein the protection layer is removed selectively by the wet etching.

4. The method according to claim 1, further comprising performing a cleaning step after selectively removing the first silicon nitride layer disposed over the first region.

5. The method according to claim 4, further comprising forming a second silicon oxide layer prior to covering the semiconductor substrate with the first silicon nitride layer, the second silicon oxide layer being removed by the cleaning step.

6. The method according to claim 1, wherein filling the trenches comprises:
   filling the trenches with the filling oxide to a level above the second silicon nitride layer;
   chemical-mechanical polishing portions of the filling oxide that are located above a part of the second silicon nitride layer over the second region; and
   selectively etching the filling oxide.

7. The method according to claim 1, wherein filling the trenches comprises filling the trenches with a filling silicon oxide to a level between 2 and 15 nm above the upper surface of the protection layer.

8. The method according to claim 1, wherein the second silicon nitride layer over the first region has a thickness of between 30 and 100 nm after the trenches are filled.

9. The method according to claim 1, wherein the protection layer has a thickness of between 2 and 20 nm.

10. The method according to claim 1, further comprising, before selectively removing the second silicon nitride layer and after removing the protection layer and selectively etching the filling oxide, performing a thermal oxidation to form a third silicon oxide layer on the second region.

11. The method according to claim 10, the third silicon oxide layer being removed when the protection layer is removed.

12. The method according to claim 1, wherein the semiconductor substrate is an upper semiconductor layer of an SOI structure.

13. The method according to claim 1, wherein the semiconductor substrate is a bulk substrate.

14. The method according to claim 1, further comprising forming an N-channel transistor in and on the first region and a P-channel transistor in and on the second region.

15. The method according to claim 14, further comprising doping the first region with p-type dopants type doping the second region with n-type dopants prior to covering the semiconductor substrate with the first silicon nitride layer.

16. A method of fabricating a semiconductor device, the method comprising:
   forming a structure at a surface of a semiconductor body, the structure including a first region and a second region that are separated by a filling material and a covering layer overlying the first region and the second region, wherein the covering layer comprises a first covering material over the first region and a second covering material over the second region, wherein first covering material overlying the first region is an oxide-nitride-oxide-nitride layer and wherein the second covering material overlying the second region is an oxide-nitride layer;
   etching the covering layer so that all of the second covering material is removed from over the second region but not all of the first covering material is removed from over the first region so that pits are formed on the surface of the filling material around the second region;
   removing remaining portions of the first covering material from over the first region; and forming an N-channel transistor in and on the first region and a P-channel transistor in and on the second region.

17. A method of fabricating a semiconductor device, the method comprising:
- forming a sacrificial structure at a surface of a semiconductor substrate having a first region and a second region, the sacrificial structure comprising a sandwich layer overlying the first region but not the second region, the sandwich layer comprising a protective layer sandwiched between layers of material having the same etch properties;
- forming an isolation trench after the fabrication of the sacrificial structure, the isolation trench extending into the semiconductor substrate at a location between the first region and the second region;
- filling the isolation trench with an insulating material; and
- removing the sacrificial structure so that the insulating material filling the isolation trench extends to a level above edges of the first region at a location adjacent the edges of the first region and so that the insulating material filling the isolation trench extends to a level below edges of the second region at a location adjacent the edges of the second region.

18. The method according to claim 17, further comprising:
- forming a first gate dielectric layer over the first region;
- forming a second gate dielectric layer over the second region;
- forming a first gate region over and insulated from the first region by the first gate dielectric layer, the first gate region spaced from the edges of the first region by the insulating material; and
- forming a second gate region over and insulated from the second region by the second gate dielectric layer.

19. The method according to claim 17, wherein the semiconductor substrate is an upper semiconductor layer of an SOI structure.

20. A method of fabricating a semiconductor device, the method comprising:
- forming a first layer over a semiconductor body that includes a first region and a second region;
- forming a second layer over the first layer;
- forming a third layer over a portion of the second layer, the third layer overlying the first region but not the second region of the semiconductor body;
- forming a fourth layer, the fourth layer overlying the third layer over the first region and overlying the second layer over the second region;
- etching a trench through the first, second, third and fourth layers and into the semiconductor body at a location between the first region and the second region;
- filling the trench with an insulating material;
- performing an etching process to expose the second region of the semiconductor body, the first region of the semiconductor body being covered by a portion of the first layer and a portion of the second layer; and
- after performing the etching process, removing the portion of the first layer and the portion of the second layer to expose the first region of the semiconductor body.

21. The method according to claim 20, wherein the insulating material that fills the trench is filled to a level above edges of the first region at a location adjacent edges of the first region.

22. The method according to claim 20, wherein the first layer comprises a first nitride layer, the second layer comprises a first oxide layer, the third layer comprises a second nitride layer, and the fourth layer comprises a second oxide layer.

* * * * *